United States Patent [19]

Hastings et al.

[11] Patent Number: 5,460,441
[45] Date of Patent: Oct. 24, 1995

[54] RACK-MOUNTED COMPUTER APPARATUS

[75] Inventors: Robert J. Hastings, Kingwood; Paily T. Varghese, Tomball, both of Tex.

[73] Assignee: Compaq Computer Corporation, Houston, Tex.

[21] Appl. No.: 332,717

[22] Filed: Nov. 1, 1994

[51] Int. Cl.[6] .................................................. A47B 77/08
[52] U.S. Cl. .................. 312/298; 312/223.2; 312/334.4; 312/334.8; 312/310; 312/309; 312/301; 312/236; 312/138.1; 361/683; 361/684; 361/685; 361/687; 361/695; 361/725; 361/726; 361/727; 361/610
[58] Field of Search ........................... 312/334.4, 223.2, 312/138.1, 236, 311, 329, 334.8, 309, 301, 310, 322, 298, 299; 361/610, 725, 726, 727, 687, 695, 683, 684, 685

[56] References Cited

U.S. PATENT DOCUMENTS

| | | | |
|---|---|---|---|
| 1,527,896 | 2/1925 | Miller | 361/727 X |
| 2,789,024 | 4/1957 | Heister | 361/726 X |
| 2,880,379 | 3/1959 | Stoddart et al. | 361/727 |
| 3,001,102 | 9/1961 | Stiefel et al. | 361/725 |
| 4,179,724 | 12/1979 | Bonhomme | 361/727 |
| 4,509,810 | 4/1985 | Erlam et al. | 361/726 X |
| 4,845,589 | 7/1989 | Weidler et al. | 361/727 X |
| 4,972,298 | 11/1990 | Casa et al. | 361/725 X |
| 5,381,315 | 1/1995 | Hamaguchi et al. | 361/727 |

Primary Examiner—Kenneth J. Dorner
Assistant Examiner—Rodney B. White
Attorney, Agent, or Firm—Konneker & Bush

[57] ABSTRACT

A rack mounted computer system has a vertically elongated cabinet structure in which a specially designed server unit is mounted. The server unit includes a slide-out outer drawer having a power supply box mounted in a lower interior portion thereof. An inner tray is slidably mounted in an upper interior portion of the outer drawer, over the power supply box, and has a system planar board and associated riser cards mounted on its top side. When the outer drawer is pulled out service access is provided to the circuit board apparatus on the inner tray. Access is provided to the power supply box by simply sliding the inner tray rearwardly relative to the opened outer drawer to expose the power supply box. Cooling fans are carried on the inner tray and within the outer drawer to cool the various computer components mounted within the server unit by flowing cooling air generally horizontally therethrough. The cabinet structure is provided with a front access door and a rear panel having ventilation openings therein. During operation of the server unit cooling fans, ambient air is sequentially drawn inwardly through the front access door ventilation openings, horizontally flowed through the server unit, and then horizontally discharged through the ventilation openings in the rear panel of the cabinet structure.

27 Claims, 5 Drawing Sheets

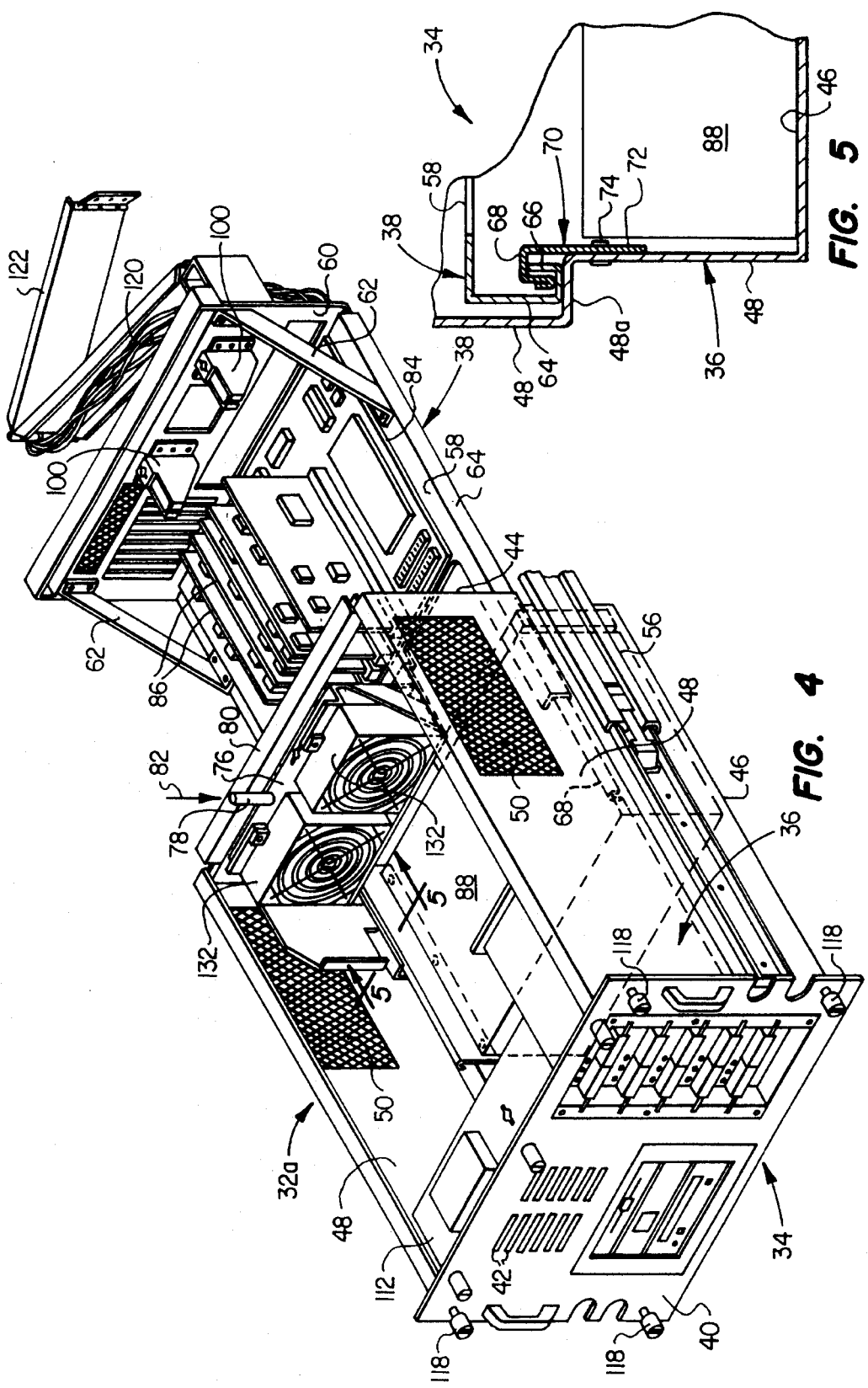

RACK-MOUNTED COMPUTER APPARATUS

BACKGROUND OF THE INVENTION

1. Field of the Invention

The present invention generally relates to computer apparatus and more particularly relates to rack-mounted computer systems.

2. Description of Related Art

In the interest of installation floor space economy main portions of high capacity computer systems are often mounted in rack structures that typically comprise vertically elongated, floor mounted cabinet assemblies of standard sizes. The cabinet assembly conventionally used for this purpose typically includes a rectangular internal frame structure externally covered by removable panels. A front access door is pivotally mounted on the front side of cabinet assembly and is typically made of glass to expose various interior components of the overall rack-mounted computer system, such as monitors and various indicating lights, to view without the necessity of opening the access door.

One of the subsystems conventionally incorporated in a rack-mounted computer system of this type is a central server which is basically a high capacity computer operatively coupled to remotely located computer work stations. To provide access to the server components they are typically mounted in a server drawer structure slidably supported in the internal frame portion of the rack cabinet for movement relative thereto between a forwardly extended component access position, and a rearwardly retracted operating position.

As in the case of other types of computers, a server unit has certain operating components with a relatively low service access frequency requirement, and other operating components with a higher service access frequency requirement. For example, the power supply box in the typical server unit does not need to be accessed for service purposes nearly as often as the system planar board and associated riser cards in the overall server unit.

In relatively low capacity server units this variance in the service access frequency requirements among the various computer components within the server drawer is of little consequence since the components can be mounted within the server drawer in a generally side-by-side orientation in a manner such that essentially all of the components are exposed when the drawer is opened. However, in the case of high capacity server units many of the internal components become large enough in horizontal directions to require that they be vertically stacked within the drawer which, due to the standard horizontal width and depth of the rack cabinet within which the drawer is slidably mounted, has a maximum horizontal width and depth. This vertical stacking of the various server components within their associated slide-out rack cabinet drawer structure conventionally requires that each time a component within a lower section of the drawer needs to be serviced the computer components above it need to be laboriously removed to permit access to the lower components, and then re-installed after the servicing of the lower components is completed.

Another problem typically present in computer rack units of conventional construction has to do with the requirement of ventilating the rack cabinet interior for the purpose of dissipating operating heat generated therein by the various computer components. The traditional method of providing this needed cabinet ventilation is to continuously force a suitable quantity of cooling air from an external source thereof upwardly through the rack cabinet, from a lower end portion thereof, and discharge the cooling air from a top end portion of the cabinet.

However, since the server portions of many conventional rack-mounted computer systems are basically high capacity personal computers, their components are typically arranged (like their desktop counterparts) in a manner such that they may be most efficiently cooled using a horizontal flow of cooling air passed through the interior of the server unit. Thus, the traditional approach of forcing cooling air vertically through the rack cabinet may provide less than ideal cooling of the one or more server units in the overall rack-mounted computer system.

From the foregoing it can be seen that it would be desirable to provide improved rack-mounted computer apparatus in which the aforementioned component access and cooling problems are eliminated or at least substantially reduced. It is accordingly an object of the present invention to provide such improved computer apparatus.

SUMMARY OF THE INVENTION

In carrying out principles of the present invention, in accordance with a preferred embodiment thereof, rack mounted computer apparatus is provided which includes a vertically elongated cabinet structure, and an outer drawer having top and bottom interior portions. First mounting means are provided for slidably mounting the outer drawer in the cabinet structure for horizontal movement relative thereto between a forwardly extended open position and a rearwardly retracted closed position. A first computer operating structure mounted in the bottom interior portion of the outer drawer and has a first service access frequency requirement. Representatively, the first computer operating structure is a power supply box.

The rack mounted computer apparatus also includes an inner tray having a top side, and second mounting means for slidably mounting the inner tray in the top interior portion of the outer drawer for horizontal movement relative to the outer drawer between a forwardly retracted position in which the inner tray is disposed in the top interior portion of the outer drawer above the first computer operating structure, and a rearwardly extended position in which the inner tray is moved out of the top interior portion of the outer drawer to expose the first computer operating structure.

A second computer operating structure, representatively a system planar board and a spaced plurality of riser cards projecting upwardly therefrom, is mounted on the top side of the inner tray, the second computer operating structure having a second service access frequency requirement greater than the first service access frequency requirement. Accordingly, after opening the outer drawer access is provided to the second computer operating structure. Access to the first computer operating structure, which is vertically stacked beneath the second computer operating structure and needs to be serviced less frequently, is provided simply by rearwardly sliding the inner tray to expose the first computer operating structure without the necessity of disconnecting and removing the second computer operating structure and then replacing it after the servicing of the first computer operating structure is completed.

According to other features of the invention, (1) cooperating means are provided on the outer drawer and the inner tray for releasably preventing the inner tray from being rearwardly moved past its rearwardly extended position thereof, (2) locking means are provided for releasably locking the inner tray, in its forwardly retracted position, to the outer drawer, and (3) means are provided for engaging and stabilizing top side edge portions of the riser cards associated with the system planar board carried by the inner tray.

According to a further feature of the invention, fan means are mounted in the outer drawer and on the inner tray and are operative to flow cooling air generally horizontally across the computer components carried in the outer drawer and on the inner tray. To accommodate this horizontal flow of cooling air, the cabinet structure is provided with a perforated front access door that overlies the front end of the outer drawer in its closed orientation, and a perforated rear panel positioned rearwardly of the outer drawer. During operation of the fan means, ambient cooling air is sequentially drawn inwardly through the front access door perforations into the interior of the cabinet structure, flowed through the inner drawer and across the inner tray, and is then discharged rearwardly through the perforations in the rear side panel of the cabinet structure.

BRIEF DESCRIPTION OF THE DRAWINGS

FIG. 4 is an enlarged scale perspective view of the server drawer structure with the upper interior tray portion in a rearwardly extended access position thereof;

FIG. 5 is an enlarged scale partial cross-sectional view through the server drawer structure taken along line 5—5 of FIG. 4;

DETAILED DESCRIPTION

Figure 1:
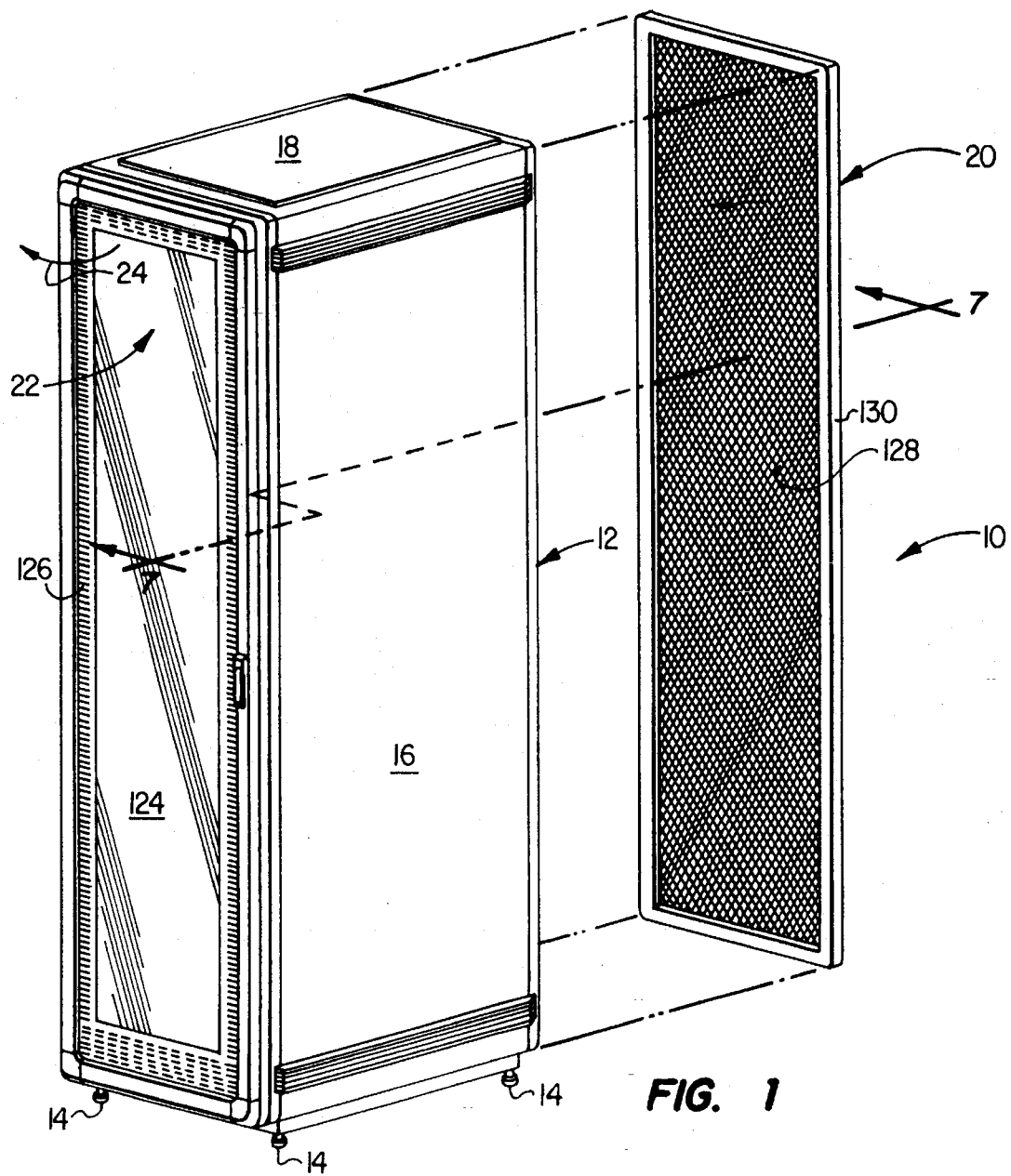
FIG. 1 is a partially exploded perspective view of rack-mounted computer apparatus embodying principles of the present invention.

Referring initially to FIG. 1, the present invention provides an improved rack-mounted computer system 10 that includes a vertically elongated, generally rectangularly configured cabinet structure 12 which may be supported on a floor by means of vertically adjustable pad members 14 depending from bottom side corner portions of the cabinet structure. Representatively, the cabinet structure 12 has a horizontal width and depth conforming to EIA (Electronics Industry Association) standards and has removable left and right side access panels 16 (only the right one of which is visible in FIG. 1), a removable top end access panel 18, and a removable rear side access panel 20. An access door 22 is hingedly secured to the front side of the cabinet structure 12 for horizontal pivotal movement, as indicated by the arrow 24, from its indicated closed position to an open position in which the front side of the interior of the cabinet structure is exposed.

Figure 2:
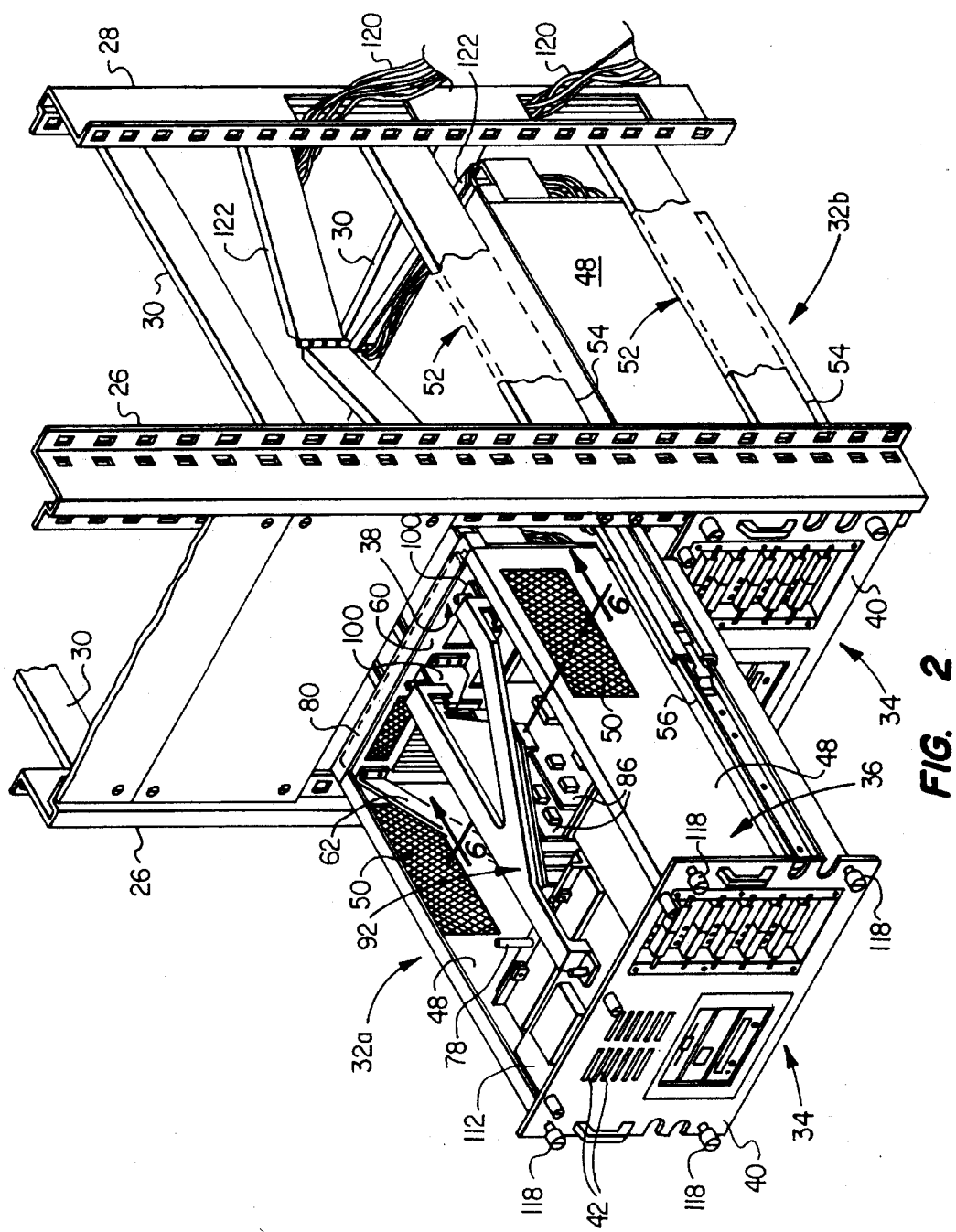
FIG. 2 is an enlarged scale perspective view of an interior support frame portion of the apparatus, and a specially designed server drawer structure slidably carried thereon.

Turning now to FIG. 2, which illustrates a vertical interior portion of the computer system 10 within the cabinet 12, the system also has an interior metal frame structure that includes four elongated vertical corner support channel members—two support channel members 26 at the front side of the cabinet, and two support channel members 28 (only one of which has been illustrated) at the back side of the cabinet. As illustrated, the support channel members 26,28 are supportingly braced to one another by various horizontal cross members 30.

Various computer components and subassemblies are operatively mounted within the interior of the frame structure and representatively include a vertically stacked pair of identical server units 32a and 32b. Each server unit 32 includes a specially designed server drawer structure 34 within which the various components of the server unit 32 are disposed in a unique manner, to be subsequently described herein, that provides substantially improved access thereto.

As best illustrated in FIG. 4, each drawer structure 34 includes an outer drawer 36, and an inner tray 38 slidingly carried within an upper portion of the outer drawer. The outer drawer 36 has a front end wall 40 with a series of air intake slots 42 formed therein, an open rear end 44, a bottom wall 46, and a pair of opposite vertical side walls 48 having perforated ventilation areas 50 formed in rear end portions thereof. A top cover panel (not shown) may be removably secured over the open top side of the outer drawer 36. For reasons subsequently described, each of the vertical side walls 48 has a horizontal ledge portion 48a formed therein as best illustrated in FIG. 5.

Each of the server drawer structures 34 is supported in the interior cabinet framework by a slide structure 52 for slidable movement relative to the cabinet between a forwardly extended access position (the indicated position of the upper drawer structure 34 in FIG. 2), and a rearwardly retracted operating position (the indicated position of the lower drawer structure 34 in FIG. 2). Each slide structure 52 includes a horizontally disposed pair of support bracket portions 54 each secured at opposite ends thereof to a corner channel pair 26 and 28, and a pair of telescoping slide portions 56 each secured at opposite ends thereof to one of the outer drawer side walls 48 and to one of the support bracket portions 54.

Figure 3:
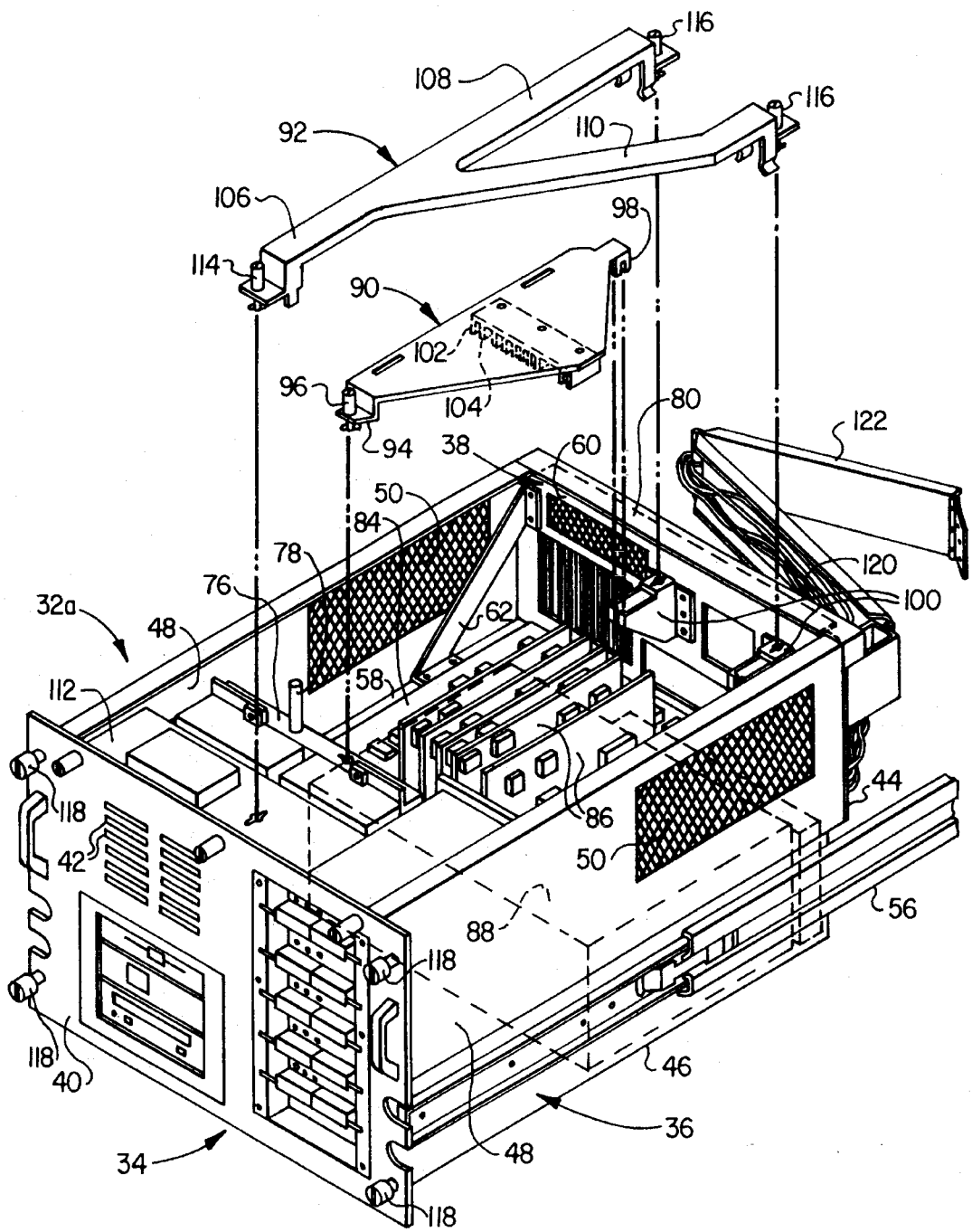
FIG. 3 is an enlarged scale, partially exploded perspective view of the server drawer structure, with an upper interior tray portion thereof being in a retracted operating position thereof.

Referring now to FIGS. 3–5, each of the inner trays 38 has a rectangular horizontal base wall 58, and an upwardly projecting rear end wall 60 secured to the base wall 58 by diagonally extending bracing strips 62. Depending from the opposite side edges of each base wall 58 are a pair of flanges 64 (see FIGS. 4 and 5) having inwardly bent and upturned lower side edge portions 66 slidingly engaging the top surfaces of the ledge portions 48a of the side walls 48 of the outer drawers 36.

The upturned portions of the side edge portions 66 are captively retained in generally inverted U-shaped upper end portions 68 of elongated retaining brackets 70 having inner side portions 72 anchored, as at 74, to the inner sides of the outer drawer side walls 48 beneath their ledge portions 48a. This structure supports each inner tray 38 on its associated outer drawer 36 for sliding movement relative thereto between a forwardly retracted operating position (FIG. 3) in which the inner tray 38 is disposed within an upper portion of its associated outer drawer 36, and a rearwardly extended position (FIG. 4) in which the inner tray 38 is moved rearwardly out of the outer drawer interior to thereby expose a bottom interior portion thereof which was previously covered by the inner tray 38 in its retracted position.

Projecting upwardly from a front end portion of the base wall 58 of each of the inner trays 38 is a wall portion 76. A spring loaded retaining pin 78 is mounted on the top side of the wall portion 76 and is resiliently biased toward its position indicated in FIGS. 3 and 4. In this position, the pin 78 is rearwardly brought into engagement with a horizontal rear top side cross member 80 on the outer drawer 36 when the inner tray 38 reaches its rearwardly extended position shown in FIG. 4, thereby preventing the removal of the inner tray 38 from the outer drawer 36. However, by depressing the pin 78, as indicated by the arrow 82 in FIG. 4, the top of the pin may be moved to below the bottom side of the cross member 80 to permit removal of the inner tray 38 from the outer drawer 36.

The system planar board 84 for each server unit 32 is secured to the top side of the inner tray base wall 58, for movement therewith into and out of an upper portion of the associated outer drawer 36, and has a spaced series of riser cards 86 perpendicularly secured to the top side thereof. Mounted within a bottom interior portion of the outer drawer 36, beneath the inner tray base wall 58, is a power supply box 88.

The power supply box 88 has a maintenance access frequency requirement less than that of the planar board 84 and its associated riser cards 86. When either of the server drawers 34 is initially pulled open (see FIGS. 2 and 3) the planar board 84 and riser cards 86 therein are exposed. All that is necessary to then gain service access to the planar board 84 and riser cards 86 is to remove two bracket structures 90 and 92 from the top side of the server drawer 34.

Figure 6:
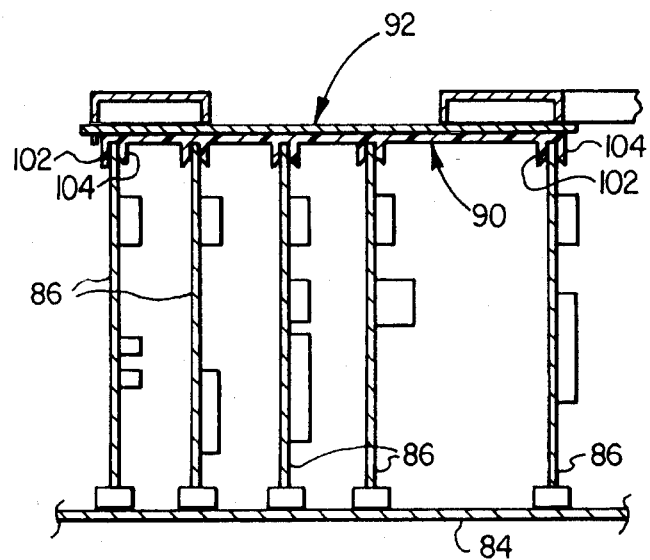
FIG. 6 is an enlarged scale partial cross-sectional view through the server drawer structure taken along line 6—6 of FIG. 2.

Bracket 90 is used to stabilize the riser cards 86 and has a front end portion 94 that is removably secured to the top of the front end wall portion 76 of the inner tray 38 by a thumb screw 96, and a rear end 98 that clips onto one of a spaced pair of forwardly projecting support brackets 100 secured to the rear end wall 60 of the inner tray 38. A spaced series of retainer tab pairs 102,104 project downwardly from the underside of the bracket 90 and releasably clip onto top side edge portions of the riser cards 86 as best illustrated in FIG. 6.

Bracket 92 overlies the bracket 90 and functions to releasably hold the inner tray 38 in its retracted position as illustrated in FIGS. 2 and 3. Bracket 92 representatively has a generally Y-shaped configuration with a front leg portion 106 and a forked pair of rear leg portions 108 and 110. The front end of leg 106 is removably secured to a horizontal top side wall portion 112 of the outer drawer 36, disposed at its front end, by a thumb screw 114, and the rear ends of legs 108,110 are removably secured to the support brackets 100 on the rear tray wall 60 by a pair of thumb screws 116.

When the two illustrated server drawer structures 34 are in their closed positions (as in the case of the lower drawer structure 34 shown in FIG. 2), each of them may be releasably locked in its closed position by means of thumb screws 118 captively retained on its outer drawer front end wall 40 and threaded into aligned openings (not shown) in the cabinet support structure.

The various cables 120 from the computer components in the two server units 32 exit the rear ends of the server drawer structures and are carried by two conventional articulated cable support arms 122 each connected at its opposite ends to a rear portion of the cabinet support structure and the rear end of one of the inner trays 38. When one of the server drawer structures 34 is opened its associated cable support arm 122 is moved to its extended position, and when the drawer structure 34 is subsequently closed its associated cable support arm 122 is moved to its folded orientation, as best illustrated in FIG. 2.

To service the circuit board apparatus carried atop the inner tray 38 the drawer structure 34 is opened as illustrated in FIG. 2, and the top side brackets 90,92 are removed as shown in FIG. 3. If it is necessary to gain access to the power supply box 88, the inner tray 38 may be simply slid rearwardly to its extended access position shown in FIG. 4 to expose the power supply box 88 which be upwardly removed through the now open top side of the outer drawer 36. The repaired power supply box 88 (or its replacement) may then be operatively mounted in the lower portion of the outer drawer 36, the inner tray 38 moved back to its retracted position, the brackets 90,92 re-installed, and the server drawer structure 34 closed again.

As can be seen from the foregoing, the server drawer structure 34 of the present invention permits computer components having different service access frequency requirements to vertically stacked therein and extend across essentially the entire horizontal width of the drawer structure, with the computer apparatus requiring more frequent service access (representatively the planar board 84 and the riser cards 86) being mounted atop the inner tray 38, and the computer apparatus requiring less frequent service access (representatively the power supply box 88) being mounted in the outer drawer 36 beneath the inner tray 38. Despite the fact that the upper computer apparatus covers and blocks the lower computer apparatus, the lower computer apparatus may be accessed and serviced without the necessity of disconnecting and removing the upper computer apparatus due to the unique provision of the slidable inner tray 38.

In addition to this compact installation of vertically stacked computer apparatus and substantially improved service access thereto, the present invention also provides for more efficient cooling ventilation of the computer apparatus installed in the server units 32 in a manner which will now be described with reference to FIGS. 1, 4 and 7.

The vertically elongated front door 22 of the cabinet structure 12 (see FIG. 1) has a central, vertically elongated rectangular glass panel portion 124 bordered by a perforated rectangular cooling air inlet area 126, and the rear side panel 20 of the cabinet 12 has a perforated main body portion 128 bordered by a rectangular frame 130. Each server drawer structure 34 is provided with a pair of circuit board cooling fans 132 secured atop a front end portion of the inner tray base wall 58 (see FIGS. 4 and 7), and a pair of power supply box cooling fans 134 (see FIG. 7) mounted on the bottom wall 46 of the outer drawer 36 directly behind the power supply box 88 adjacent the open rear end 44 of the outer drawer 36.

Figure 7:
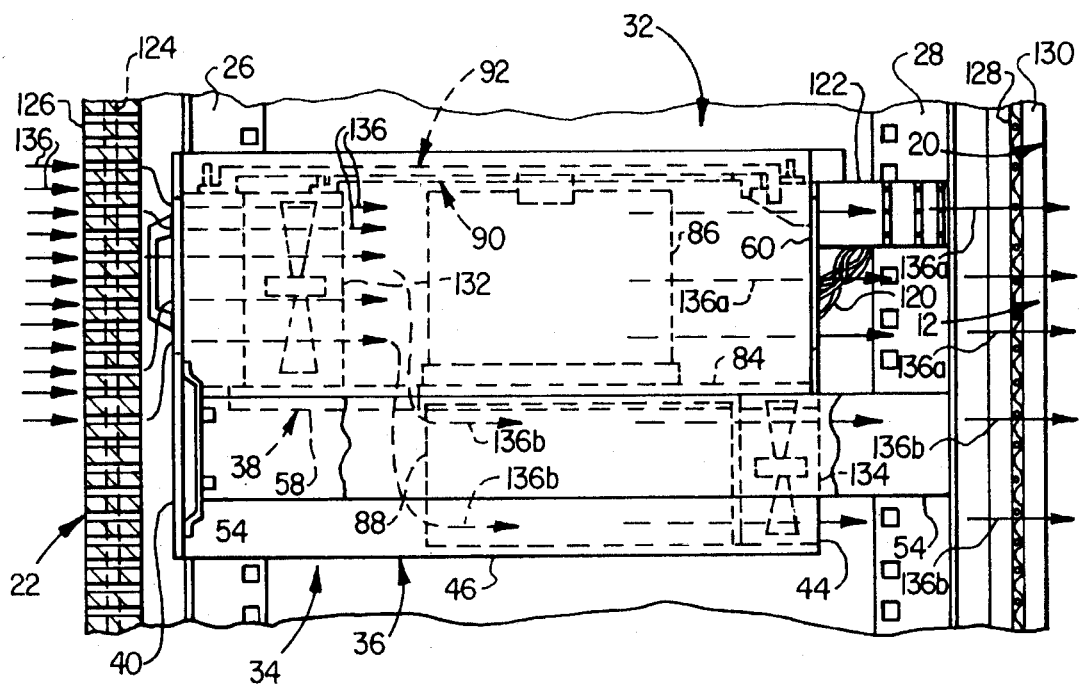
FIG. 7 is an enlarged scale simplified partial cross-sectional view through the rack-mounted computer apparatus taken along line 7—7 of FIG. 1.

As best illustrated in FIG. 7, during operation of the fans 132,134 in one of the server units 32 ambient cooling air 136 is drawn rearwardly into the cabinet structure 12 through the perforated area 126 in the front cabinet door 22 (see also FIG. 1) by the fans 132 and is then drawn into the interior of the outer drawer 36 through the air intake slots 42 in its front end wall 40.

A portion 136a of the incoming cooling air 136 is forced by the fans 132 across the planar board 84 and the riser cards 86, outwardly through the perforated areas 50 in the outer drawer side walls 48 (see FIG. 2) and then discharged rearwardly through the perforated body portion 128 of the rear cabinet panel 20. The remainder 136b of the incoming ambient cooling air 136 is drawn by the fans 134 rearwardly across the power supply box 88 and then discharged out the open rear end 44 of the outer drawer 36 and then rearwardly through the perforated body portion 128 of the rear cabinet panel 20. In this manner, the cabinet structure 12 uniquely accommodates the horizontal cooling air flow through each server unit 32.

The foregoing detailed description is to be clearly understood as being given by way of illustration and example only, the spirit and scope of the present invention being limited solely by the appended claims.

What is claimed is:

1. Rack mounted computer apparatus comprising:

a vertically elongated cabinet structure;

an outer drawer having top and bottom interior portions;

first mounting means for slidably mounting said outer drawer in said cabinet structure for horizontal movement relative thereto between a forwardly extended open position and a rearwardly retracted closed position;

a first computer operating structure mounted in said bottom interior portion of said outer drawer and having a first service access frequency requirement;

an inner tray having a top side;

second mounting means for slidably mounting said inner tray in said top interior portion of said outer drawer for horizontal movement relative to said outer drawer between a forwardly retracted position in which said inner tray is disposed in said top interior portion of said outer drawer above said first computer operating structure, and a rearwardly extended position in which said inner tray is moved out of said top interior portion of said outer drawer to expose said first computer operating structure; and a second computer operating structure mounted on said top side of said inner tray for movement therewith and having a second service access frequency requirement greater than said first service access frequency requirement.

2. The rack mounted computer apparatus of claim 1 wherein:

said first computer operating structure includes a printed circuit board.

3. The rack mounted computer apparatus of claim 1 wherein:

said second computer operating structure includes a power supply box.

4. The rack mounted computer apparatus of claim 1 further comprising:

cooperating means on said outer drawer and said inner tray for releasably preventing said inner tray from being rearwardly moved past said rearwardly extended position thereof.

5. The rack mounted computer apparatus of claim 4 wherein said cooperating means include:

a blocking member carried by said outer drawer and extending horizontally across a rear top side portion thereof, and a spring loaded pin member projecting upwardly from a front end portion of said inner tray and positioned to rearwardly engage said blocking member, as said inner tray rearwardly reaches said rearwardly extended position thereof, in a manner preventing rearward removal of said inner tray from said outer drawer, said pin member being resiliently depressible to permit it to be horizontally moved under said blocking member to thereby permit rearward removal of said inner tray from said outer drawer.

6. The rack mounted computer apparatus of claim 1 further comprising:

locking means for releasably locking said inner tray, in said forwardly retracted position thereof, to said outer drawer.

7. The rack mounted computer apparatus of claim 6 wherein said locking means include:

a locking bracket disposed above said inner tray and having a first end portion releasably secured to a front portion of said outer drawer and a second end portion releasably secured to a rear portion of said inner tray.

8. The rack mounted computer apparatus of claim 1 wherein:

said first computer operating structure includes a horizontally oriented system planar board mounted on said top side of said inner tray, and a spaced plurality of vertically oriented riser cards operatively mounted on the top side of said system planar board, and said rack mounted computer apparatus further comprises means for engaging and stabilizing top side edge portions of said riser cards.

9. The rack mounted computer apparatus of claim 8 wherein said means for engaging and stabilizing include:

a support bracket disposed above said top side edge portions of said riser cards and having a front end portion removably secured to a front end portion of said inner tray, a rear end portion removably secured to a rear end portion of said inner tray, and an underside portion having clip means depending therefrom and releasably engaging said top side edge portions of said riser cards.

10. The rack mounted computer apparatus of claim 1 wherein:

said outer drawer has air inlet openings, disposed in a front end portion thereof, through which cooling air may be drawn into the interior of said outer drawer, said rack mounted computer apparatus further comprises fan means, carried by said outer drawer and said inner tray, for drawing cooling air inwardly through said air inlet openings, flowing the cooling air across said first and second computer operating structures, and then generally horizontally discharging the cooling air from said outer drawer and said inner tray, and said cabinet structure has a vertically oriented front side access door closable over said outer drawer in said rearwardly retracted closed position thereof and having air inlet means therein through which ambient cooling air may be inwardly drawn during operation of said fan means, and a vertically oriented rear side panel having air outlet means formed therein through which cooling air discharged by said fan means may be discharged to the exterior of said cabinet structure.

11. The rack mounted computer apparatus of claim 10 wherein:

said front side access door has a central transparent portion peripherally bordered by a perforated portion defining said air inlet means, and said rear side panel has a central perforated portion defining said air outlet means.

12. The rack mounted computer apparatus of claim 10 wherein said fan means include:

a first cooling fan supported in said bottom interior portion of said outer drawer behind said first computer operating structure, and a second cooling fan supported on said inner tray forwardly of said second computer operating structure.

13. The rack mounted computer apparatus of claim 12 wherein:
    said outer drawer has a pair of opposite vertical side walls extending in a front-to-rear direction, and
    said side walls have ventilation air discharge perforations therein disposed on upper rear portions thereof.

14. The rack mounted computer apparatus of claim 1 wherein:
    said outer drawer has a pair of opposite vertically extending side walls each having a vertically intermediate horizontal ledge portion thereon, and
    said second mounting means include:
       first and second retaining brackets secured to the interior surfaces of said side walls beneath said ledge portions thereof and having upper, generally inverted U-shaped top portions overlying said ledge portions, and
       opposite depending side edge portions of said inner tray having inwardly and upwardly bent bottom side edge sections captively and slidably retained in said generally inverted U-shaped top portions of said first and second retaining brackets.

15. A server unit for a rack mounted computer system having a cabinet structure in which various selected computer apparatus may be operatively mounted, said server unit comprising:
    an outer drawer mountable in the cabinet structure for horizontal sliding movement relative thereto between a forwardly extended open position and a rearwardly retracted closed position, said outer drawer having an open rear end and top and bottom interior portions;
    a first computer operating structure mounted in said bottom interior portion of said outer drawer and having a first service access frequency requirement;
    an inner tray having a top side and being slidingly mounted in said top interior portion of said outer drawer for horizontal movement relative thereto between a forwardly retracted position in which said inner tray is positioned over said first computer operating structure, and a rearwardly extended position in which said inner tray is rearwardly moved away from and exposes said first computer operating structure; and
    a second computer operating structure mounted on said top side of said inner tray and having a second service access frequency requirement greater than said first service access frequency requirement.

16. The server unit of claim 15 wherein:
    said first computer operating structure includes a printed circuit board.

17. The server unit of claim 15 wherein:
    said second computer operating structure includes a power supply box.

18. The server unit of claim 15 further comprising:
    cooperating means on said outer drawer and said inner tray for releasably preventing said inner tray from being rearwardly moved past said rearwardly extended position thereof.

19. The server unit of claim 15 wherein said cooperating means include:
    a blocking member carried by said outer drawer and extending horizontally across a rear top side portion thereof, and
    a spring loaded pin member projecting upwardly from a front end portion of said inner tray and positioned to rearwardly engage said blocking member, as said inner tray rearwardly reaches said rearwardly extended position thereof, in a manner preventing rearward removal of said inner tray from said outer drawer, said pin member being resiliently depressible to permit it to be horizontally moved under said blocking member to thereby permit rearward removal of said inner tray from said outer drawer.

20. The server unit of claim 15 further comprising:
    locking means for releasably locking said inner tray, in said forwardly retracted position thereof, to said outer drawer.

21. The server unit of claim 20 wherein said locking means include:
    a locking bracket disposed above said inner tray and having a first end portion releasably secured to a front portion of said outer drawer and a second end portion releasably secured to a rear portion of said inner tray.

22. The server unit of claim 15 wherein:
    said first computer operating structure includes a horizontally oriented system planar board mounted on said top side of said inner tray, and a spaced plurality of vertically oriented riser cards operatively mounted on the top side of said system planar board, and
    said server unit further comprises means for engaging and stabilizing top side edge portions of said riser cards.

23. The server unit of claim 22 wherein said means for engaging and stabilizing include:
    a support bracket disposed above said top side edge portions of said riser cards and having a front end portion removably secured to a front end portion of said inner tray, a rear end portion removably secured to a rear end portion of said inner tray, and an underside portion having clip means depending therefrom and releasably engaging said top side edge portions of said riser cards.

24. The server unit of claim 15 wherein:
    said outer drawer has air inlet openings, disposed in a front end portion thereof, through which cooling air may be drawn into the interior of said outer drawer, and
    said server unit further comprises fan means, carried by said outer drawer and said inner tray, for drawing cooling air inwardly through said air inlet openings, flowing the cooling air across said first and second computer operating structures, and then generally horizontally discharging the cooling air from said outer and said inner tray.

25. The server unit of claim 24 wherein said fan means include:
    a first cooling fan supported in said bottom interior portion of said outer drawer behind said first computer operating structure, and
    a second cooling fan supported on said inner tray forwardly of said second computer operating structure.

26. The server unit of claim 25 wherein:
    said outer drawer has a pair of opposite vertical side walls extending in a front-to-rear direction, and
    said side walls have ventilation air discharge perforations therein disposed on upper rear portions thereof.

27. The server unit of claim 15 wherein:
    said outer drawer has a pair of opposite vertically extending side walls each having a vertically intermediate horizontal ledge portion thereon, and
    said inner tray is mounted on said outer drawer by means of first and second retaining brackets secured to the interior surfaces of said side walls beneath said ledge portions thereof and having upper, generally inverted U-shaped top portions overlying said ledge portions, and opposite depending side edge portions of said inner tray having inwardly and upwardly bent bottom side edge sections captively and slidably retained in said generally inverted U-shaped top portions of said first and second retaining brackets.

* * * * *